(12) United States Patent
Mizuta et al.

(10) Patent No.: US 9,991,140 B2
(45) Date of Patent: Jun. 5, 2018

(54) SUBSTRATE HEATING DEVICE, SUBSTRATE HEATING METHOD AND COMPUTER-READABLE STORAGE MEDIUM

(71) Applicant: TOKYO ELECTRON LIMITED, Tokyo (JP)

(72) Inventors: Masato Mizuta, Koshi (JP); Koji Takayanagi, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 193 days.

(21) Appl. No.: 14/816,550

(22) Filed: Aug. 3, 2015

(65) Prior Publication Data
US 2016/0042984 A1 Feb. 11, 2016

(30) Foreign Application Priority Data

Aug. 8, 2014 (JP) .................................. 2014-162764

(51) Int. Cl.
*F27B 5/02* (2006.01)
*H01L 21/67* (2006.01)
(Continued)

(52) U.S. Cl.
CPC .... *H01L 21/67103* (2013.01); *F27B 17/0025* (2013.01); *H01L 21/67017* (2013.01); *H01L 21/68742* (2013.01)

(58) Field of Classification Search
CPC ......... C23C 16/455; C23C 14/54; F27D 7/06; B01D 5/00; B01D 53/00; Y10S 55/30; Y10S 61/09; F27B 5/02
See application file for complete search history.

(56) References Cited

U.S. PATENT DOCUMENTS 6,002,109 A * 12/1999 Johnsgard ........... C23C 16/4411
118/50.1
6,143,080 A * 11/2000 Bartholomew ..... C23C 16/4412
118/715
(Continued)

FOREIGN PATENT DOCUMENTS

JP 60132321 A * 7/1985 ......... C23C 16/4412
JP 2002-184682 A 6/2002
JP 2010-045185 A 2/2010

*Primary Examiner* — Gregory A Wilson
(74) *Attorney, Agent, or Firm* — Nath, Goldberg & Meyer; Jerald L. Meyer; Annie Kock

(57) ABSTRACT

A substrate heating device includes: heating modules each having a processing vessel within which a heating plate is disposed, an gas inlet port for introducing a purge gas into a processing atmosphere, and an exhaust port for exhausting the processing atmosphere; individual exhaust paths each connected to the exhaust port of the heating modules; a common exhaust path connected to downstream ends of the individual exhaust paths of the heating modules; a branch path branched from the individual exhaust paths and opened to the outside of the processing vessel; and an exhaust flow rate adjusting unit configured to adjust a flow rate ratio of an exhaust flow rate of a gas exhausted from the exhaust port into the common exhaust path and an introduction flow rate of a gas introduced from the outside of the processing vessel into the common exhaust path through the branch path.

11 Claims, 12 Drawing Sheets

(51) Int. Cl.
*H01L 21/687* (2006.01)
*F27B 17/00* (2006.01)

(56) References Cited

U.S. PATENT DOCUMENTS

| | | | | |
|---|---|---|---|---|
| 6,644,964 | B2* | 11/2003 | Shirakawa | H01L 21/67109 |
| | | | | 118/728 |
| 6,887,803 | B2* | 5/2005 | Yoo | F27B 17/0025 |
| | | | | 118/50.1 |
| 7,992,318 | B2* | 8/2011 | Kawaji | H01L 21/67109 |
| | | | | 118/58 |
| 2004/0260483 | A1* | 12/2004 | Kar | G01M 15/102 |
| | | | | 702/45 |
| 2010/0291850 | A1* | 11/2010 | Sabbaghian | B08B 15/002 |
| | | | | 454/61 |
| 2012/0083194 | A1* | 4/2012 | Hagensen | F23J 11/02 |
| | | | | 454/16 |
| 2014/0295667 | A1* | 10/2014 | Kaga | C23C 16/34 |
| | | | | 438/680 |
| 2015/0011076 | A1* | 1/2015 | Demars | H01L 21/67017 |
| | | | | 438/478 |
| 2016/0124438 | A1* | 5/2016 | Minamida | H01L 21/6715 |
| | | | | 137/1 |
| 2016/0126112 | A1* | 5/2016 | Minamida | H01L 21/67017 |
| | | | | 134/57 R |
| 2016/0160387 | A1* | 6/2016 | Quinn | C23C 16/4412 |
| | | | | 117/97 |

* cited by examiner

SUBSTRATE HEATING DEVICE, SUBSTRATE HEATING METHOD AND COMPUTER-READABLE STORAGE MEDIUM

CROSS-REFERENCE TO RELATED APPLICATION

This application claims the benefit of Japanese Patent Application No. 2014-162764, filed on Aug. 8, 2014, in the Japan Patent Office, the disclosure of which is incorporated herein in its entirety by reference.

TECHNICAL FIELD

The present disclosure relates to a substrate heating device and a substrate heating method which heat a substrate mounted on a heating plate, and a computer-readable storage medium including a computer program.

BACKGROUND

In a semiconductor device manufacturing process, a process of heating a semiconductor wafer (hereinafter referred to as a "wafer") as a substrate having a chemical solution coated on the surface thereof by a heating device is included. In order to remove a sublimate generated from the chemical solution, the heating process is often performed by mounting the wafer on a heating plate installed within a processing vessel and exhausting the interior of the processing vessel. For example, a semiconductor manufacturing apparatus having a hierarchical structure is sometimes configured such that heating devices are installed at individual levels and heating modules each including the processing vessel are installed in the respective levels. For example, the respective processing vessels installed at the same level are connected to a common exhaust duct through an exhaust pipe provided with a damper. The interior of the exhaust duct is exhausted at a predetermined exhaust flow rate.

In the heating modules, with a view toward the compatibility of increasing film thickness uniformity within a plane of the wafer and reliability of removing a sublimate from the interior of the processing vessel, consideration has been given to changing an exhaust flow rate in the processing vessel while processing one wafer. However, in the aforementioned heating devices, if the exhaust flow rate in one processing vessel is changed, the exhaust flow rate in another processing vessel sharing the exhaust duct with the one processing vessel is also changed. For that reason, it becomes possible that the ability to remove the sublimate from the interior of another processing vessel is reduced and the film thickness uniformity deteriorates.

With regard to the change of the exhaust flow rate in the processing vessel, a description will be made on one example in which three processing vessels are connected to an exhaust duct. It is assumed that the interior of the exhaust duct is exhausted at 30 L/min and further that the respective processing vessels are exhausted at, e.g., 10 L/min, with dampers of exhaust pipes connected to the respective processing vessels kept in an open state. In this state, if the damper of the exhaust pipe connected to one processing vessel is closed and if the exhaust flow rate in one processing vessel becomes equal to 0 L/min, the exhaust flow rate in the remaining two processing vessels is increased to 30/2=15 L/min. This is because the interior of the exhaust duct is exhausted at 30 L/min.

For example, a heating device which, while processing a wafer, changes a supply amount of a purge gas supplied into a processing vessel is known. There is also known a liquid processing device in which a plurality of cups is connected to a common exhaust duct through exhaust pipes having dampers and in which the exhaust flow rates in the respective cups are controlled independently of one another. However, these devices are not capable of solving the aforementioned problem.

SUMMARY

Some embodiments of the present disclosure provide a substrate heating device which includes a plurality of heating modules each having a processing vessel for processing a substrate and an exhaust path common to the respective heating modules and which can accurately control the exhaust flow rates in the respective heating modules. Some embodiments of the present disclosure provide a substrate heating method which can accurately control the exhaust flow rates in the respective heating modules, and a computer-readable storage medium.

According to one embodiment of the present disclosure, there is provided a substrate heating device, including: a plurality of heating modules, each of which includes a processing vessel within which a heating plate for mounting and heating a substrate is disposed, an gas inlet port for introducing a purge gas into a processing atmosphere existing within the processing vessel, and an exhaust port for exhausting the processing atmosphere; individual exhaust paths, each of which is connected to the exhaust port of each of the plurality of heating modules; a common exhaust path connected to downstream ends of the individual exhaust paths of the plurality of heating modules; a branch path branched from each of the individual exhaust paths and opened to the outside of the processing vessel; and an exhaust flow rate adjusting part configured to adjust a flow rate ratio of an exhaust flow rate of a gas exhausted from the exhaust port into the common exhaust path and an introduction flow rate of a gas introduced from the outside of the processing vessel into the common exhaust path through the branch path.

According to another embodiment of the present disclosure, there is provided a substrate heating method which makes use of a substrate heating device including: a plurality of heating modules, each of which includes a processing vessel within which a heating plate for mounting and heating a substrate is disposed, an gas inlet port for introducing a purge gas into a processing atmosphere existing within the processing vessel, and an exhaust port for exhausting the processing atmosphere; individual exhaust paths, each of which is connected to the exhaust port of each of the plurality of heating modules; and a common exhaust path connected to downstream ends of the individual exhaust paths of the plurality of heating modules; and a branch path branched from each of the individual exhaust paths and opened to the outside of the processing vessel, the method including: mounting the substrate on the heating plate; adjusting, with an exhaust flow rate adjusting part, a flow rate ratio of an exhaust flow rate of a gas exhausted from the exhaust port into the common exhaust path and an introduction flow rate of a gas introduced from the outside of the processing vessel into the common exhaust path through the branch path, thereby maintaining a low exhaust state in which the processing atmosphere is exhausted at a low exhaust flow rate; and subsequently, adjusting the flow rate ratio with the exhaust flow rate adjusting part, thereby maintaining a high exhaust state in which the processing atmosphere is exhausted at a flow rate higher than the low exhaust flow rate.

According to another embodiment of the present disclosure, there is provided a non-transitory computer-readable storage medium which stores a computer program used in a substrate heating device for heating a substrate mounted on a heating plate, wherein the program incorporates steps for implementing the aforementioned substrate heating method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
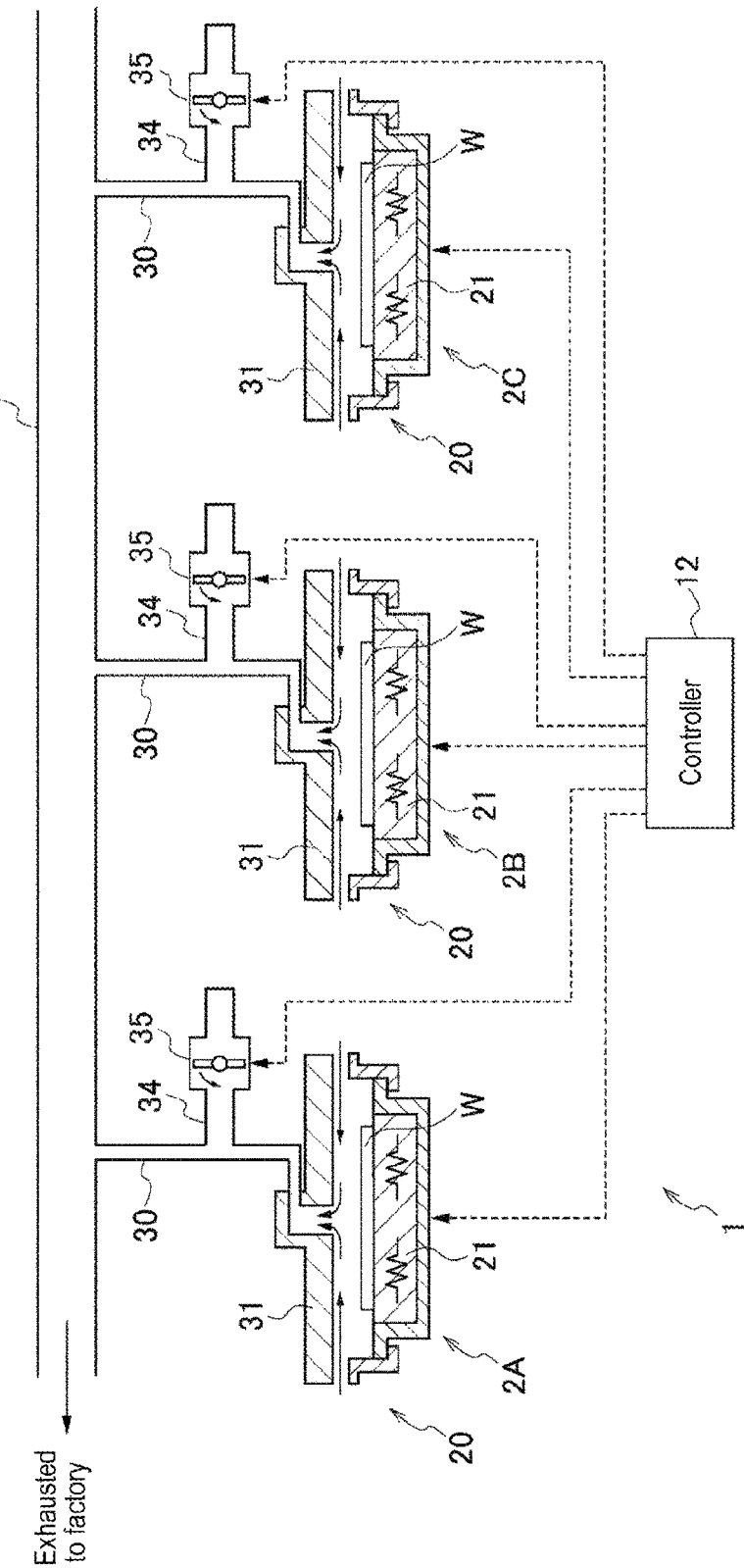
FIG. 1 is an overall configuration view of a heating device according to an embodiment of the present disclosure.

A heating device 1 of a wafer W according to an embodiment of the present disclosure will be described with reference to the schematic configuration view shown in FIG. 1. The heating device 1 is configured to heat a wafer W whose surface is coated with a chemical solution at the outside of the heating device 1. In this example, the diameter of the wafer W is 300 mm. The chemical solution contains a polymer (a low-molecular-weight polymer) having a relatively low molecular weight and a cross-linking agent. When the chemical solution is heated to, e.g., 250 degrees C., the polymer undergoes a cross-linking reaction and forms an organic film called an SOC film, which is mainly composed of carbon. The content percentage of carbon in the organic film is, e.g., 90% or higher. After the heating is performed by the heating device 1, a silicon-oxide-containing film called an SOG film and a resist film are laminated on the organic film in the named order at the outside of the heating device 1. A pattern formed in the resist film is sequentially transferred to the films of lower layers by virtue of dry etching. That is to say, the organic film is mainly composed of carbon and is used as a pattern mask for etching the films positioned under the organic film.

In the description of the heating device 1, the heating device 1 includes a plurality of heating modules 2A to 2C, each of which heats the wafer W, an exhaust duct 11 and a controller 12. The exhaust duct 11 is installed so as to extend in a horizontal direction and is connected at the downstream side thereof to an exhaust path of a factory where the heating device 1 is installed. The downstream ends of exhaust pipes 30 forming individual exhaust paths which constitute the heating modules 2A to 2C are connected to different points of the exhaust duct 11 arranged along the extension direction of the exhaust duct 11. That is to say, the exhaust duct 11 constitutes a common exhaust path for the heating modules 2A to 2C. The interior of the exhaust duct 11 is always exhausted at a predetermined exhaust flow rate and is heated by a heater (not shown) in order to prevent condensation of a sublimate introduced from the heating modules 2A to 2C.

Figure 2:
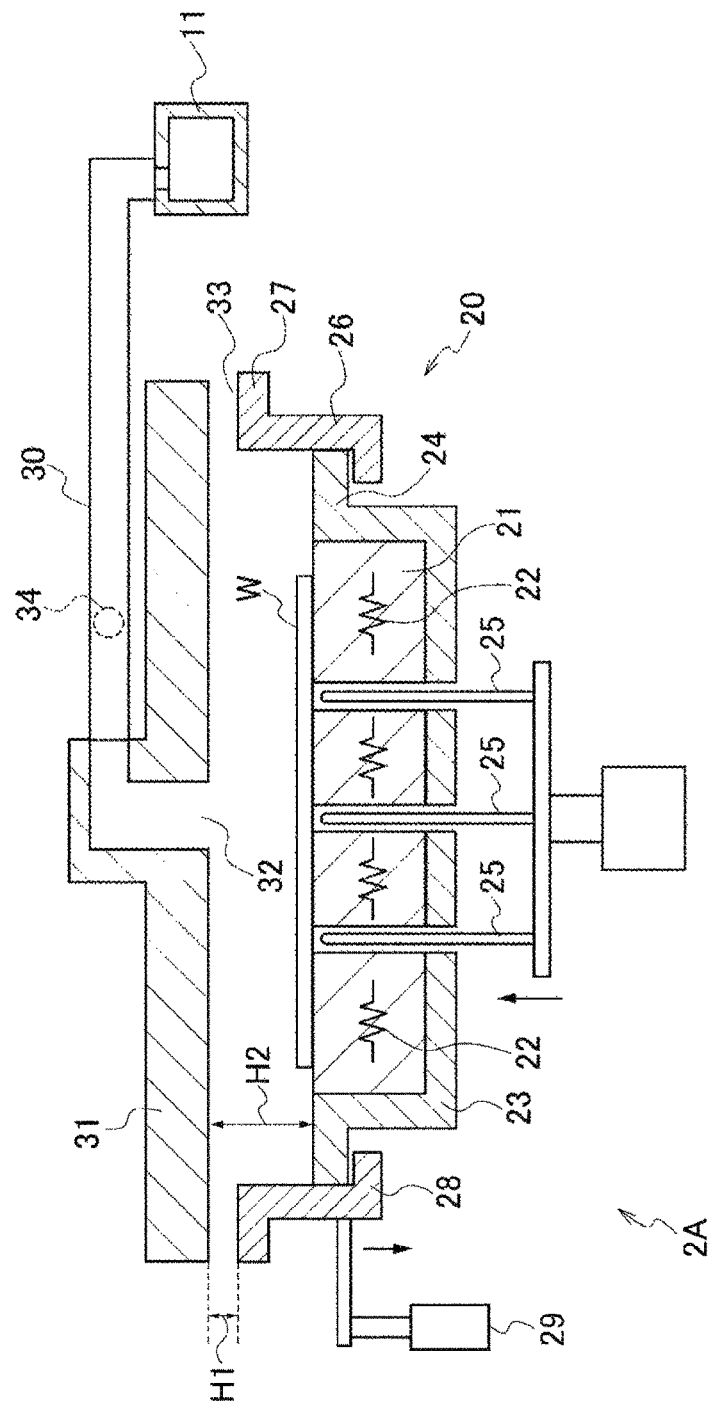
FIG. 2 is a vertical sectional side view of a heating module which constitutes the heating device.

The heating modules 2A to 2C are identical in configuration with one another and are capable of independently heating the wafer W. The heating module 2A whose vertical sectional side view is shown in FIG. 2 will be described as one representative example of the heating modules 2A to 2C. In FIG. 2, reference numeral 21 designates a horizontal circular heating plate provided with a heater 22. The heating plate 21 is configured to heat the wafer W mounted on the surface thereof. In FIG. 2, reference numeral 23 designates a base which surrounds and supports a bottom surface and a side surface of the heating plate 21. The base 23 is formed into a bottom-closed cylindrical shape. In FIG. 2, reference numeral 24 designates a flange which forms an upper end portion of the base 23. In FIG. 2, reference numeral 25 designates lift pins penetrating through the heating plate 21 and the base 23 in the vertical direction. The lift pins 25 perform delivery of the wafer W between a transfer mechanism not shown and the heating plate 21.

An erected cylindrical shutter 26 is installed on an outer periphery of the flange 24. The upper end portion of the shutter 26 extends outward at the upper side of the base 23 and the heating plate 21, thereby forming a flange 27. The lower end portion of the shutter 26 extends inward, thereby forming a ring 28. The ring 28 overlaps with the flange 24 of the base 23. The ring 28 is formed so as to prevent leakage of a gas from between the shutter 26 and the base 23. In FIG. 2, reference numeral 29 designates an elevator mechanism which moves the shutter 26 up and down with respect to the heating plate 21. When the wafer W is processed, the shutter 26 is located at a position shown in FIG. 2. When the wafer W is delivered with respect to the heating plate 21, the shutter 26 is moved down from the position shown in FIG. 2 such that the shutter 26 does not hinder the delivery of the wafer W.

In the upper side of the shutter 26, a circular cover 31 is installed in an opposing relationship with the heating plate 21 so as to cover the shutter 26 and the heating plate 21. A processing vessel 20 for processing the wafer W is configured by the cover 31, the base 23 and the shutter 26. The interior of the processing vessel 20 is configured to serve as a wafer processing atmosphere. In a ceiling portion of the cover 31, an exhaust port 32 is formed so as to face the central portion of the wafer W mounted on the heating plate 21. The reason for forming the exhaust port 32 at the upper side of the wafer W in this way is to make sure that pressure loss is reduced when exhausting the interior of the processing vessel 20 and the exhaust can be performed at a relatively large flow rate. Since a relatively large amount of sublimate is generated from the organic film, it is advantageous to employ the configuration capable of increasing the exhaust flow rate. The gap existing between the cover 31 and the flange 27 of the shutter 26 constitutes a gas inlet port 33 extending along the circumferential direction of the heating plate 21. The gas inlet port 33 is formed over the entire circumference of the wafer W. The vertical width of the gas inlet port 33 indicated by H1 in FIG. 2 may be, e.g., from 0.5 mm to 1 mm. Furthermore, the height ranging from the front surface of the heating plate 21 to the rear surface of the cover 31, which is indicated by H2 in FIG. 2, may be, e.g., 30 mm.

One end portion of the exhaust pipe 30 is connected to the cover 31 so as to exhaust the interior of the processing vessel 20 through the exhaust port 32. The other end portion of the exhaust pipe 30 is connected to the exhaust duct 11 as set forth above. Since the interior of the exhaust duct 11 is exhausted as described above, the processing atmosphere within the processing vessel 20 is exhausted toward the exhaust duct 11. As the interior of the processing vessel 20 is exhausted in this way, a gas, e.g., air, is admitted from the outside of the processing vessel 20 into the processing vessel 20 through the gas inlet port 33 at a flow rate corresponding to the exhaust flow rate of the gas exhausted from the interior of the processing vessel 20. Then, the air flows from the peripheral edge portion of the wafer W toward the central portion thereof along the radial direction of the wafer W, thereby purging the processing atmosphere. Thereafter, the air flows into the exhaust port 32 and is exhausted.

Figure 3:
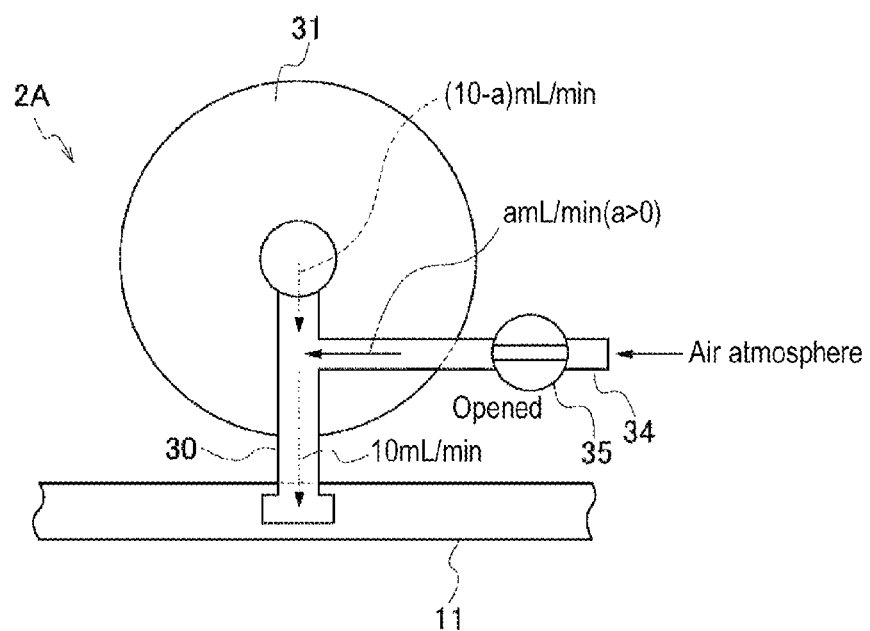
FIG. 3 is a schematic diagram showing a state of a damper of the heating module.

The exhaust pipe 30 is branched to form a branch pipe 34 which constitutes a branch path. The other end portion of the branch pipe 34 is opened toward an air atmosphere at the outside of the processing vessel 20. A damper 35 which can be opened and closed and which constitutes an exhaust flow rate adjusting part is installed in the branch pipe 34 (see FIG. 1). FIG. 3 shows an upper surface of the heating module 2A. The open state of the damper 35 is schematically shown in FIG. 3. The flow of a gas in the heating module 2A of this state is indicated by arrows. The gas flow will be described in detail. By exhausting the interior of the exhaust duct 11, air is admitted from the air atmosphere into the exhaust duct 11 through the branch pipe 34 and the exhaust pipe 30. Accordingly, the total sum of the flow rate of the air flowing from the branch pipe 34 into the exhaust pipe 30 and the flow rate of the air exhausted from the interior of the processing vessel 20 becomes equal to the flow rate of the air flowing from the exhaust pipe 30 into the exhaust duct 11. Thus, for example, if the air is admitted from the exhaust pipe 30 into the exhaust duct 11 at 10 L/min and if the air flow rate in the branch pipe 34 is assumed to be a L/min, the exhaust flow rate of the gas exhausted from the interior of the processing vessel 20 is (10-a) L/min. Since a is larger than 0, the exhaust flow rate of the gas exhausted from the interior of the processing vessel 20 is smaller than 10 L/min.

Figure 4:
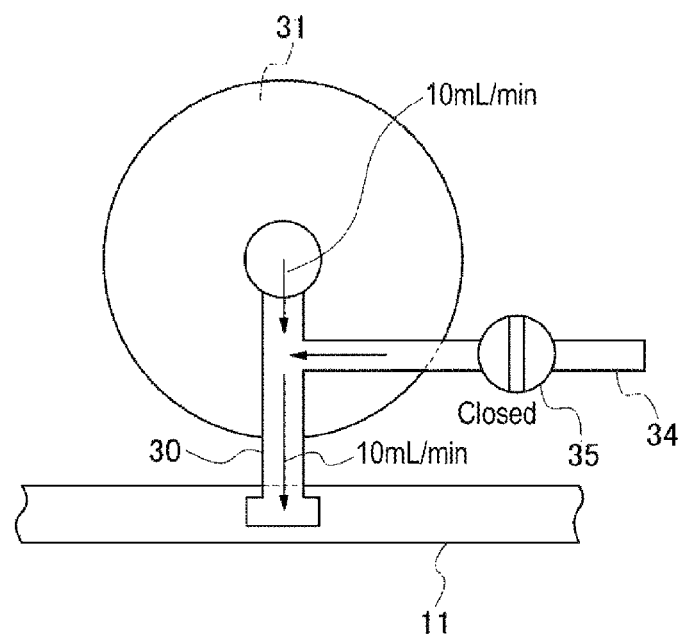
FIG. 4 is a schematic diagram showing another state of the damper of the heating module.

If the opening degree of the damper 35 decreases from the state shown in FIG. 3, the flow rate, a, of the air flowing from the branch pipe 34 toward the exhaust pipe 30 becomes smaller. At this time, the flow rate of the air supplied from outside the processing vessel 20 into the processing vessel 20 through the gas inlet port 33 and then flowing into the exhaust pipe 30 grows larger so as to compensate for the reduction in the amount of flow rate a. That is to say, the exhaust flow rate of the gas exhausted from the interior of the processing vessel 20 increases. In this way, the damper 35 adjusts the flow rate ratio of the exhaust flow rate of the gas exhausted from the exhaust port 32 of the processing vessel 20 toward the exhaust duct 11 and the introduction flow rate of the gas introduced from the branch pipe 34 into the exhaust duct 11. Just like FIG. 3, FIG. 4 schematically shows a closed state of the damper 35. When the damper 35 is closed, the air flow rate a in the branch pipe 34 becomes zero. For that reason, the exhaust flow rate of the gas exhausted from the interior of the processing vessel 20 is (10-0)=10 L/min. If the damper 35 is opened again from the state shown in FIG. 4, the value of the flow rate, a, increases. Thus, the exhaust flow rate of the gas exhausted from the interior of the processing vessel 20 becomes smaller again.

By opening and closing the damper 35 in this way, the exhaust flow rate of the gas exhausted from the interior of the processing vessel 20 is switched. In the following description, the state in which the damper 35 is opened as shown in FIG. 3 and the exhaust flow rate of the gas exhausted from the interior of the processing vessel 20 becomes smaller will be sometimes referred to as low exhaust or a low exhaust state. The state in which the damper 35 is closed as shown in FIG. 4 and the exhaust flow rate of the gas exhausted from the interior of the processing vessel 20 becomes larger will be sometimes referred to as high exhaust or a high exhaust state. As set forth above, the heating module 2A is configured such that air is supplied from the end portion of the branch pipe 34 and the gas inlet port 33 of the processing vessel 20 into the exhaust duct 11, respectively. For that reason, even if the high exhaust and the low exhaust of the processing vessel 20 are switched by opening or closing the damper 35 of the branch pipe 34, the variation in the flow rate of the air flowing from the exhaust pipe 30 toward the exhaust duct 11 is suppressed. Since the variation in the flow rate of the air flowing toward the exhaust duct 11 is suppressed in this way, it is possible to suppress the variation in the exhaust flow rate of the air exhausted from the respective exhaust pipes 30 of the heating modules 2B and 2C toward the exhaust duct 11. This makes it possible to suppress the variation in the exhaust flow rate of the air exhausted from the interior of the processing vessel 20 of each of the heating modules 2B and 2C. Similarly, even if the high exhaust and the low exhaust are switched in each of the heating modules 2B and 2C, the variation in the exhaust flow rate of the air exhausted from the interior of the processing vessel 20 of another heating module is suppressed.

In view of the evaluation tests to be described later, in some embodiments, when the interior of the processing vessel 20 is in a low exhaust state, the exhaust flow rate of the gas exhausted from the interior of the processing vessel 20 is 0.16 L/min or less. In order to set the exhaust flow rate at a sufficiently low value in this way, the branch pipe 34 is configured such that the pressure loss in the branch pipe 34 is reduced and the flow rate of the air exhausted from the branch pipe 34 is increased. A pressure loss in a pipe is inversely proportional to the size of an inner diameter of the pipe and is proportional to the length of a flow path of the pipe. Therefore, the value (=A) obtained by dividing the length of a flow path of a pipe by the inner diameter of a pipe in case of the branch pipe 34 is set to become sufficiently smaller than the value (=B) obtained by dividing the length of a flow path of a pipe by the inner diameter of a pipe in case of the exhaust pipe 30. For example, A/B becomes 1/25 or less.

Next, a description will be made on the controller 12 as a computer shown in FIG. 1. A program stored in a computer-readable storage medium such as, e.g., a flexible disk, a compact disk, a hard disk, a MO (magneto-optical) disk or a memory card, is installed in the controller 12. Commands (individual steps) are incorporated in the installed program so that control signals can be transmitted to the respective parts of the heating device 1 to control the operations thereof. Specifically, individual operations such as the opening/closing of the dampers 35 in the respective heating modules 2A to 2C, the control of electric power supplied to the heater 22, the up/down movement of the shutter 26 and the lift pins 25, and so forth are controlled by the program.

In the heating modules 2A to 2C, the low exhaust state and the high exhaust state of the interior of the processing vessel 20 described above are switched during the process of heating the wafer W. A description will be made on the reason for performing the switching. As described in the BACKGROUND section, if the wafer W is heated, a sublimate is generated from a coated film of a chemical solution formed on the surface of the wafer W. The sublimate becomes particles if it is attached to the wafer W or the inside of the processing vessel 20 and is condensed. With a view to removing the sublimate from the interior of the processing vessel 20 and preventing contamination caused by the particles, the exhaust in the high exhaust state is performed in some embodiments.

However, if processing is performed in the high exhaust state from the start of processing of the wafer W to the end of processing of the wafer W, the film thickness at the lower side of the exhaust port 32, namely in the central portion of the wafer W, becomes larger than the film thickness in the peripheral edge portion of the wafer W. The reason is as follows. Prior to generation of the cross-linking reaction, the coated film has a low viscosity. The film thickness of the coated film tends to be reduced when the coated film is exposed to an air flow within the processing vessel 20. In the high exhaust state, the air flowing from the peripheral edge portion of the wafer W toward the central portion thereof is sucked toward the exhaust port 32, namely upward, prior to reaching the central portion of the wafer W. For that reason, the film thickness in the central portion of the wafer W becomes larger. That is to say, the film thickness in the central portion of the wafer W becomes larger because the central portion of the wafer W is hardly exposed to an air flow.

As the cross-linking reaction occurs, the viscosity of the coated film grows higher. If the coated film is cured, the film thickness of the coated film is hardly affected by the air flow. Furthermore, if the temperature of the wafer W becomes higher, a surplus low-molecular-weight polymer or a surplus cross-linking agent is sublimated. Thus, a sublimate is easily generated from the coated film. However, when the temperature of the wafer W remains low, a sublimate is not generated. Accordingly, in some embodiments, a decrease in the uniformity of a film thickness distribution within a plane of the wafer W is suppressed by maintaining a low exhaust state for a predetermined time from the start of processing of the wafer W, and then a sublimate is removed by maintaining a high exhaust state after the predetermined time is elapsed.

Figure 5:
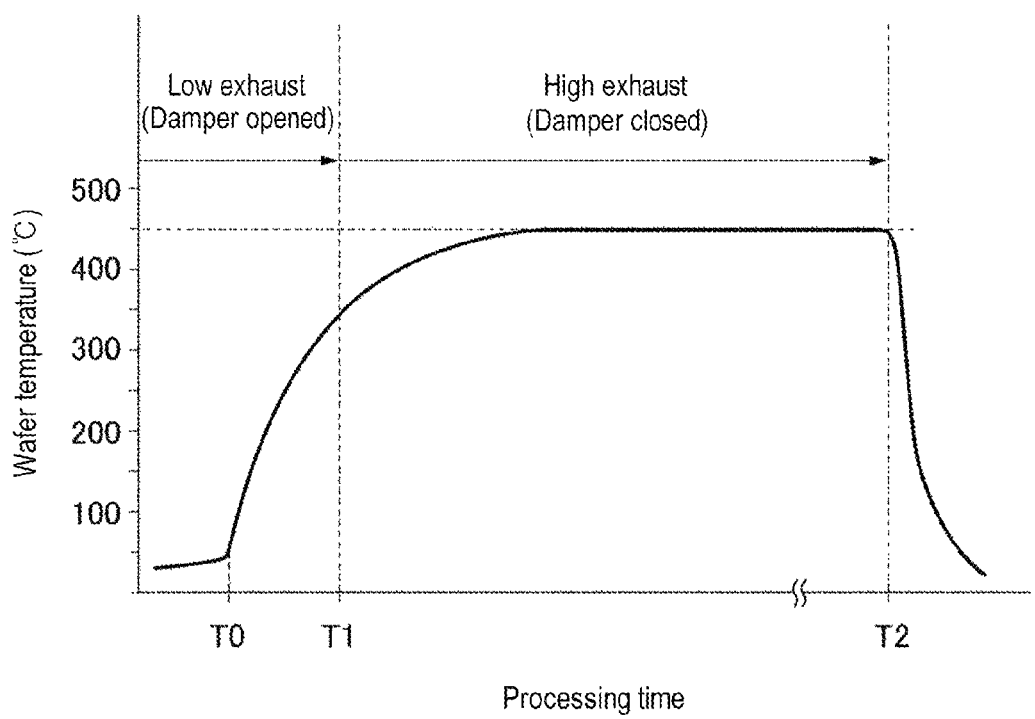
FIG. 5 is a graphical representation showing the relationship between a damper switching timing and a wafer temperature in the heating module.

FIG. 5 is a graph showing the switching timing of the damper 35 when the exhaust is switched in the aforementioned manner during the heating process of the wafer W. The vertical axis of the graph indicates the temperature (degrees C.) of the wafer W. The horizontal axis of the graph indicates the processing time. In the heating modules 2A to 2C, the processing is performed pursuant to this timing chart. As a representative example, the processing performed in the heating module 2A will be described. For example, the damper 35 is first opened as shown in FIG. 3 before the wafer W having the coated film formed thereon is carried into the processing vessel 20. Thus, the interior of the processing vessel 20 is kept in a low exhaust state in which air is exhausted at an exhaust flow rate of 0.16 L/min or less. Then, the wafer W is delivered to the lift pins 25 at the upper side of the heating plate 21 heated to, e.g., 450 degrees C. The lift pins 25 are moved down such that the wafer W is mounted on the heating plate 21 (time T0). Since the interior of the processing vessel 20 is kept in the low exhaust state, the air admitted from the outside of the processing vessel 20 into the processing vessel 20 flows from the peripheral edge portion of the of the wafer W toward the central portion thereof, and then flows toward the exhaust port 32 formed above the central portion of the wafer W. The air is exhausted through the exhaust port 32. That is to say, the temperature of the wafer W increases while the central portion and the peripheral edge portion of the wafer W are all exposed to an air flow.

The temperature of the wafer W then reaches 250 degrees C. which is a temperature (cross-linking temperature) at which a cross-linking reaction is started in the coated film. Thus, the coated film begins to cure. The temperature of the wafer W is further increased, whereby the cross-linking reaction and the curing of the coated film progress. This leads to an increase in the amount of a sublimate generated from the coated film. At time T1 elapsed a predetermined time from time T0, the damper 35 is closed as shown in FIG. 4 and the interior of the processing vessel 20 is switched to a high exhaust state. The interval between time T0 and time T1 is, e.g., 10 seconds. In the high exhaust state, the sublimate generated from the coated film is rapidly exhausted from the exhaust port 32 and is removed from the interior of the processing vessel 20. The temperature of the wafer W is further increased to 450 degrees C. Thereafter, the wafer W is lifted up from the heating plate 21 by virtue of the lift pins 25. Thus, the temperature of the wafer W is decreased and the damper 35 is opened (time T2) such that the interior of the processing vessel 20 is switched to a low exhaust state. Then, the wafer W is carried out from the processing vessel 20 by a transfer mechanism.

Figure 6:
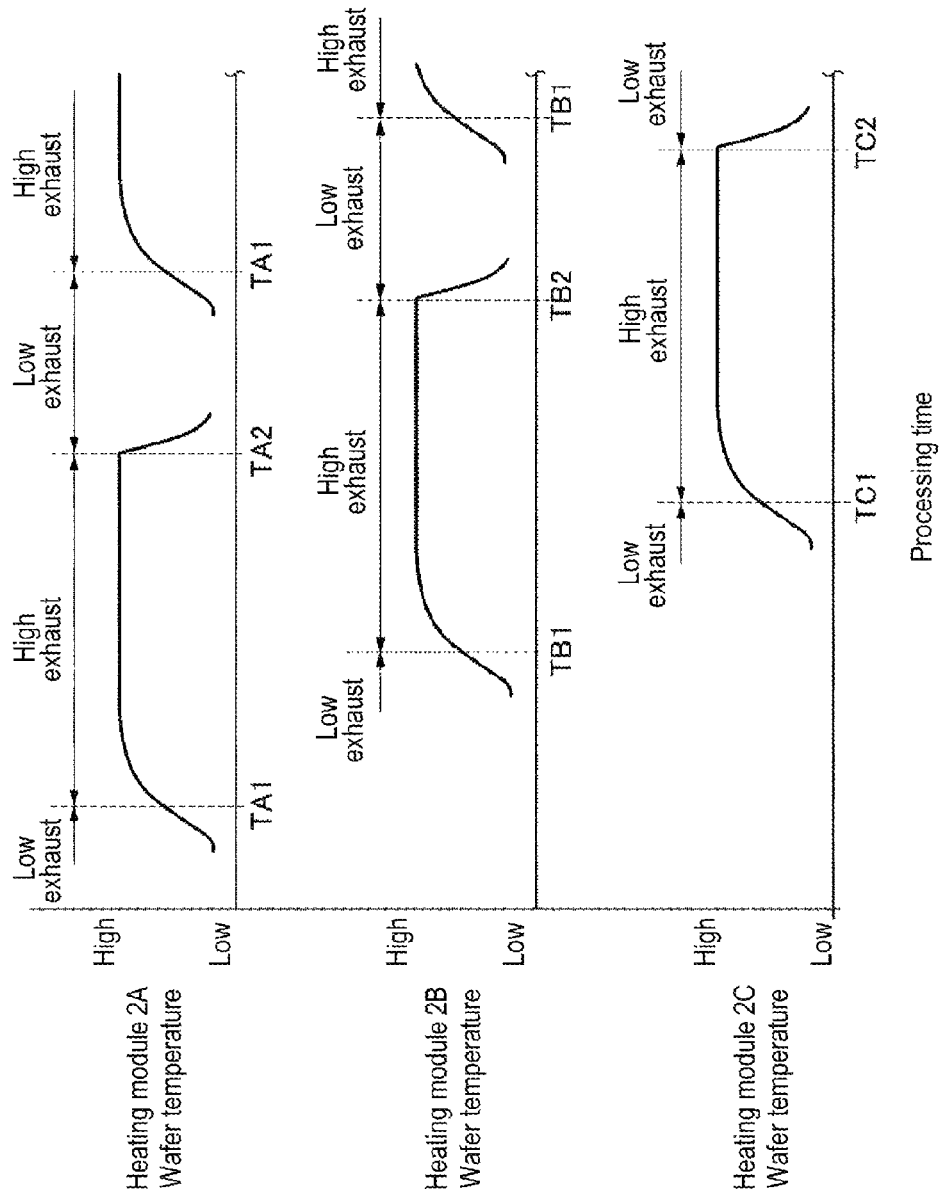
FIG. 6 is a graphical representation showing the relationship between the damper switching timing and the wafer temperature in the heating device.

Next, a description will be made on one example of the overall operation of the heating device 1. In the heating device 1, the wafer W is repeatedly transferred, for example, in the order of the heating modules 2A, 2B and 2C. A heating process is started in the heating module to which the wafer W is transferred. During the heating process, the opening/closing of the damper 35 is switched as described with reference to the graph shown in FIG. 5. The processed wafer W is carried out from one of the heating modules 2A, 2B and 2C in which the heating process of the wafer W is completed. A subsequent wafer W is transferred to the heating module. Similar to FIG. 5, FIG. 6 is a graph showing the opening/closing switching timings of the dampers 35 of the respective heating modules 2A to 2C and the temperatures of the wafers W of the respective heating modules 2A to 2C when the aforementioned process is performed. In the graph shown in FIG. 6, in order to distinguish the operations of the respective heating modules from one another, the time indicated by T1 in FIG. 5, at which the damper 35 is switched from an open state to a closed state, is indicated by TA1, TB1 and TC1 with respect to the heating modules 2A, 2B and 2C. The time indicated by T2 in FIG. 5, at which the damper 35 is switched from a closed state to an open state, is indicated by TA2, TB2 and TC2 with respect to the heating modules 2A, 2B and 2C.

Figure 7:
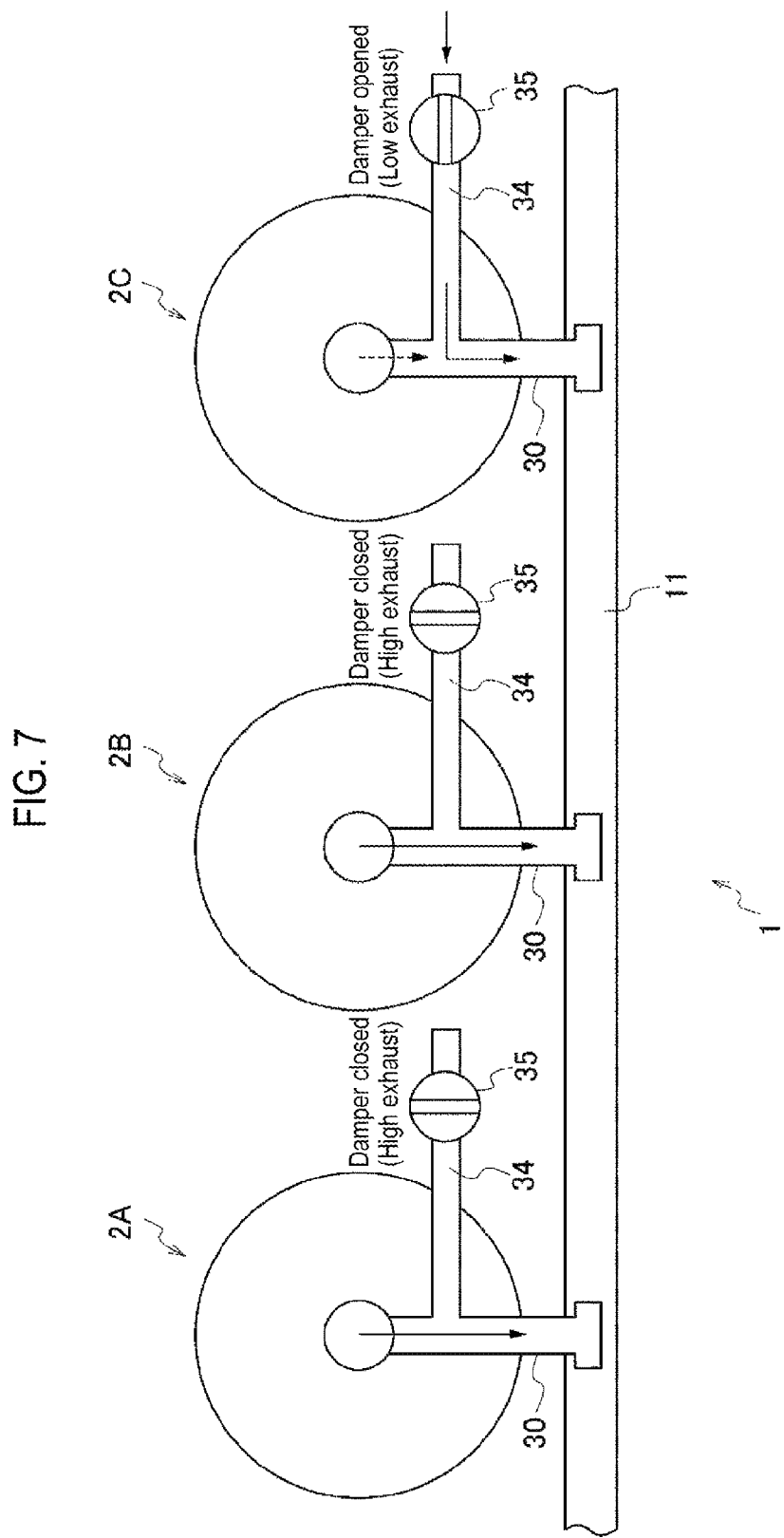
FIG. 7 is a schematic diagram showing the states of dampers at a specified time during the processing of the wafer.

Since the wafer W (a first wafer W) is transferred and processed in the order of the heating modules 2A, 2B and 2C as described above, time elapses in the order of the times TA1, TB1 and TC1. At the respective times, the heating modules 2A, 2B and 2C are switched from the low exhaust state to the high exhaust state. Similar to FIGS. 3 and 4, FIG. 7 schematically shows the states of the dampers 35 of the respective heating modules 2A to 2C during a time period from the time TB1 to the time TC1. In the heating modules 2A and 2B, the dampers 35 are closed to keep the interior of the processing vessel 20 in the high exhaust state. In the heating module 2C, the damper 35 is opened to keep the interior of the processing vessel 20 in the low exhaust state.

After the time TC1 elapses and the heating module 2C is switched to the high exhaust state, the heating processes of the first wafer W are completed in the order of the heating modules 2A, 2B and 2C. The first wafer W is carried out from the processing vessel 20. Time elapses in the order of the times TA2, TB2 and TC2. At the respective times, the dampers 35 of the heating modules 2A to 2C are opened and the heating modules 2A to 2C are switched from the high exhaust state to the low exhaust state. Upon carrying out the first wafer W, a second wafer W is carried into each of the heating modules 2A, 2B and 2C. The damper 35 is closed during the processing of the second wafer W. That is to say, the second times TA1, TB1 and TC1 have elapsed. At the respective times, the heating modules 2A, 2B and 2C are switched from the low exhaust state to the high exhaust state. In this example, the second time TA1 is set to exist, e.g., between the time TB2 and the time TC2.

Just like the first wafer W, the second wafer W transferred to each of the heating modules 2A to 2C is carried out from the processing vessel 20 as soon as the processing thereof is completed. Upon completing the processing, the respective heating modules 2A to 2C are switched from the high exhaust state to the low exhaust state. That is to say, while not shown in FIG. 6, the second times TA2, TB2 and TC2 elapse in the named order. A subsequent wafer W is transferred and processed in the order of the heating modules 2A, 2B and 2C. Upon completing a heating process, the subsequent wafer W is carried out from the processing vessel 20.

In this way, the wafer W is individually transferred to the heating modules 2A to 2C and is individually subjected to the heating process in the respective heating modules 2A to 2C. Thus, the opening/closing switching of each of the dampers 35 is performed such that the switching of the low exhaust state and the high exhaust state is individually performed. When the opening/closing of the damper 35 is switched in one of the heating modules 2A to 2C, the flow rate of the air flowing from the exhaust pipe 30 of the heating module into the exhaust duct 11 is maintained at a constant rate as described with reference to FIGS. 3 and 4. Therefore, the variation in the flow rate of the air flowing from the exhaust pipe 30 of another heating module into the exhaust duct 11 is suppressed. As a result, the variation in the exhaust flow rate of the air exhausted from the inside of the processing vessel 20 in another heating module is prevented.

According to the heating device 1 described above, each of the heating modules 2A, 2B and 2C sharing the exhaust duct 11 with one another includes: the processing vessel 20 configured to heat the wafer W while purging the wafer processing atmosphere with the air introduced from the surroundings; the exhaust pipe 30 configured to interconnect the exhaust duct 11 and the processing vessel 20; the branch pipe 34 branched from the exhaust pipe 30 with one end portion thereof opened to the atmosphere; and the damper 35 configured to open and close the flow path of the branch pipe 34. In this configuration, the amount of air admitted from the branch pipe 34 into the exhaust duct 11 is controlled by opening or closing the damper 35. This makes it possible to control the exhaust flow rate in the processing vessel 20 and to suppress the variation in the flow rate of the air flowing from the exhaust pipe 30 toward the exhaust duct 11. Accordingly, even if the exhaust flow rate in the processing vessel 20 of one heating module is changed, there is no possibility that the exhaust flow rate in the processing vessel 20 of another heating module is changed resultantly. Therefore, when switching the interior of the processing vessel 20 to the low exhaust state and the high exhaust state, it is possible to accurately control the exhaust flow rate in the respective exhaust states. Accordingly, it is possible to reduce deterioration of a film thickness distribution within a plane of the wafer W. It is also possible to restrain a sublimate from remaining within the processing vessel 20 and to restrain particles generated from the sublimate from adhering to the wafer W or the processing vessel 20. In addition, the branch pipe 34 provided with the damper 35 does not need to be kept at a high temperature in order to prevent condensation of the sublimate. It is therefore possible to prevent the damper 35 from being damaged by heat.

In the processing example described above, the wafer W is mounted on the heating plate 21. After a predetermined time, the damper 35 is closed to switch the low exhaust state to the high exhaust state. Instead of time-dependently controlling the damper 35 in the aforementioned manner, for example, a radiation thermometer may be installed in the processing vessel 20 so that the temperature of the wafer W can be measured by the radiation thermometer. The damper 35 may be controlled such that, if the temperature of the wafer W thus measured reaches a predetermined temperature, the damper 35 is closed.

Figure 8:
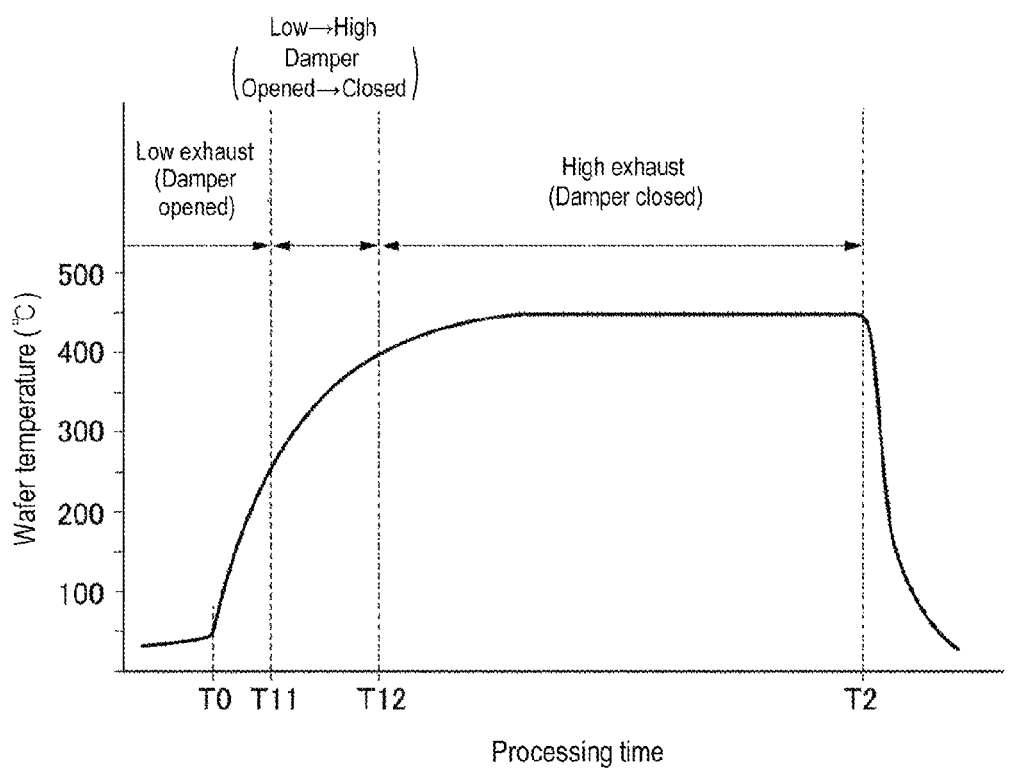
FIG. 8 is a graphical representation showing the relationship between the damper switching timing and the wafer temperature in the heating module.

In the processing example described above, the low exhaust state and the high exhaust state are instantly switched to each other. However, the switching may be gradually performed. Similar to FIG. 5, FIG. 8 is a graph showing the relationship between the opening/closing timing of the damper 35 and the temperature of the wafer W. FIG. 8 shows an example in which the damper 35 is controlled such that the switching from the low exhaust state to the high exhaust state is gradually performed. A description will be made primarily on a difference between the processing shown by the graph of FIG. 8 and the processing described with the graph of FIG. 5. The processing vessel 20 is kept in the low exhaust state. At time T0, the wafer W is mounted on the heating plate 21. Thereafter, the opening degree of the damper 35 begins to be changed at, e.g., time T11 at which the temperature of the wafer W becomes equal to 250 degrees C., i.e., the cross-linking temperature. The opening degree of the damper 35 is gradually reduced. The amount of air introduced from the branch pipe 34 into the exhaust pipe 30 is gradually decreased while the exhaust flow rate in the processing vessel 20 is gradually increased. At time T12, the damper 35 is closed. Thus, the flow rate of the air in the protrusion portions 43 becomes zero and the processing vessel 20 is switched to the high exhaust state. The interval between time T11 and time T12 is 5 seconds or more. In this example, the interval between time T11 and time T12 is 10 seconds. The interval between time T0 and time T11 is, e.g., 5 seconds.

The reason for gradually closing the damper 35 is as follows. If the damper 35 is suddenly closed, the air does not suddenly flow from the air atmosphere toward the downstream side of the damper 35 of the branch pipe 34. Thus, the pressure is reduced at the downstream side of the damper 35. Due to this pressure reduction, it is likely that the sublimate flowing from the processing vessel 20 into the exhaust pipe 30 does not move toward the exhaust duct 11 but flows into the branch pipe 34 where the sublimate is condensed. That is to say, by gradually closing the damper 35, it is possible to prevent condensation of the sublimate in the branch pipe 34 and to prevent particles otherwise generated from the sublimate from scattering toward the processing vessel 20 when the air flows through the branch pipe 34 with the damper 35 opened again.

Figure 9:
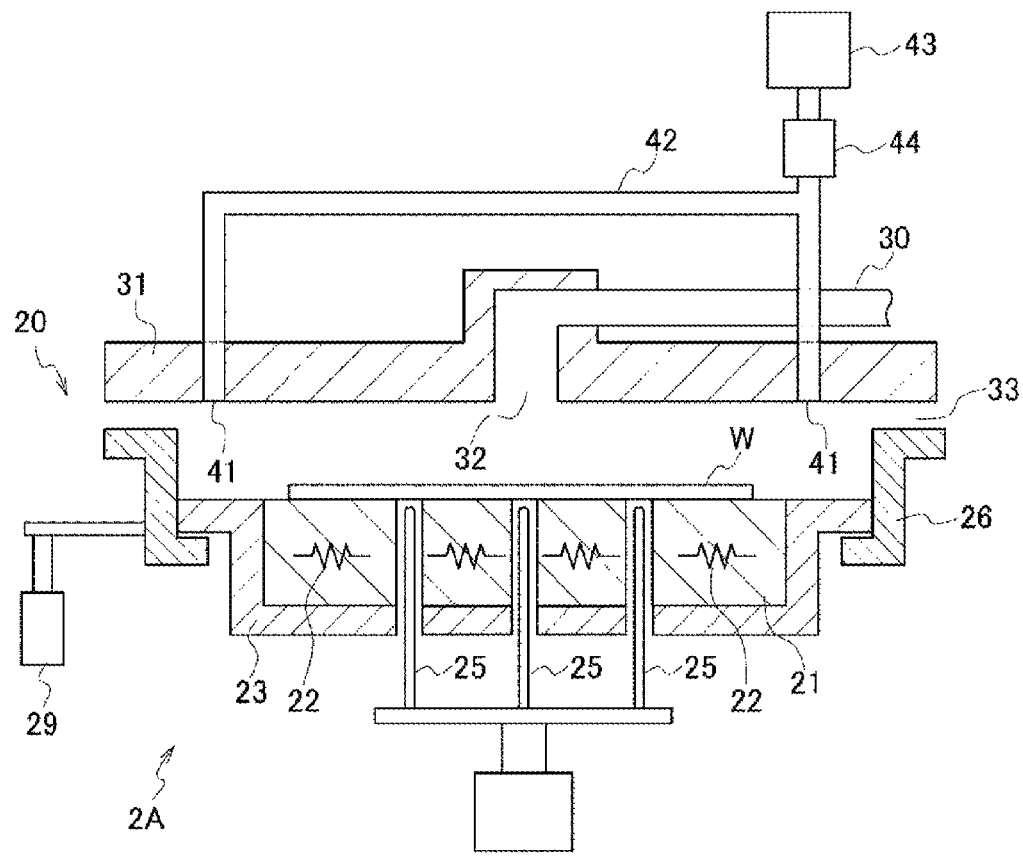
FIG. 9 is a vertical sectional side view showing another configuration example of the heating module.

FIG. 9 shows a modification of the heating module 2A. On the lower surface of the cover 31 of the heating module 2A shown in FIG. 9, gas inlet ports 41 are formed so as to be opened toward the outer side of the wafer W mounted on the heating plate 21. For example, the plurality of gas inlet ports 41 are formed along the circumference of the wafer W and are connected through a pipe line 42 to a supply source 43 of air as a purge gas. A heating part 44 is installed in the pipe line 42 to heat the air flowing through the pipe line 42. The temperature of the air supplied from the gas inlet ports 41 is maintained by the heating part 44 at a temperature of, e.g., 40 degrees C. or higher.

If the heating module 2A performs processing in the same manner as shown in the graph of FIG. 5, the damper 35 is closed at, e.g., time T1, and the interior of the processing vessel 20 is kept at the high exhaust state. The air heated by the heating part 44 begins to be supplied to the respective gas inlet ports 41. By the supply of the air, the exhaust flow rate of the air exhausted from the exhaust port 32 can be reliably kept high. It is therefore possible to efficiently and reliably remove the sublimate. Thereafter, the damper 35 is opened at, e.g., time T2, and the interior of the processing vessel 20 is kept at the low exhaust state. The supply of the air is stopped.

Since the air heated by the heating part 44 is supplied from the gas inlet ports 41, it is possible to prevent the sublimate from being cooled and condensed by the air. During the processing of the wafer W, the temperature of the processing vessel 20 is increased by the heating plate 21. Therefore, an air flow path may be formed in the cover 31 such that the air supplied from the supply sources 43 to the cover 31 is heated by the heat of the heating plate 21 before the air is ejected from the gas inlet ports 41 toward the processing atmosphere. In this case, it may be possible to employ a configuration in which the heating part 44 is not installed. The gas inlet ports 41 are not limited to being formed in the cover 31. As an example, the gas inlet ports 41 may be installed outside the wafer mounting region of the heating plate 21. Moreover, the external gas supplied into the processing vessel 20 is not limited to air. An inert gas such as a nitrogen gas or the like may be supplied into the processing vessel 20. The external gas supplied into the processing vessel 20 includes a gas introduced from the gas inlet port 33 and a gas supplied from the supply source 43.

Figure 10:
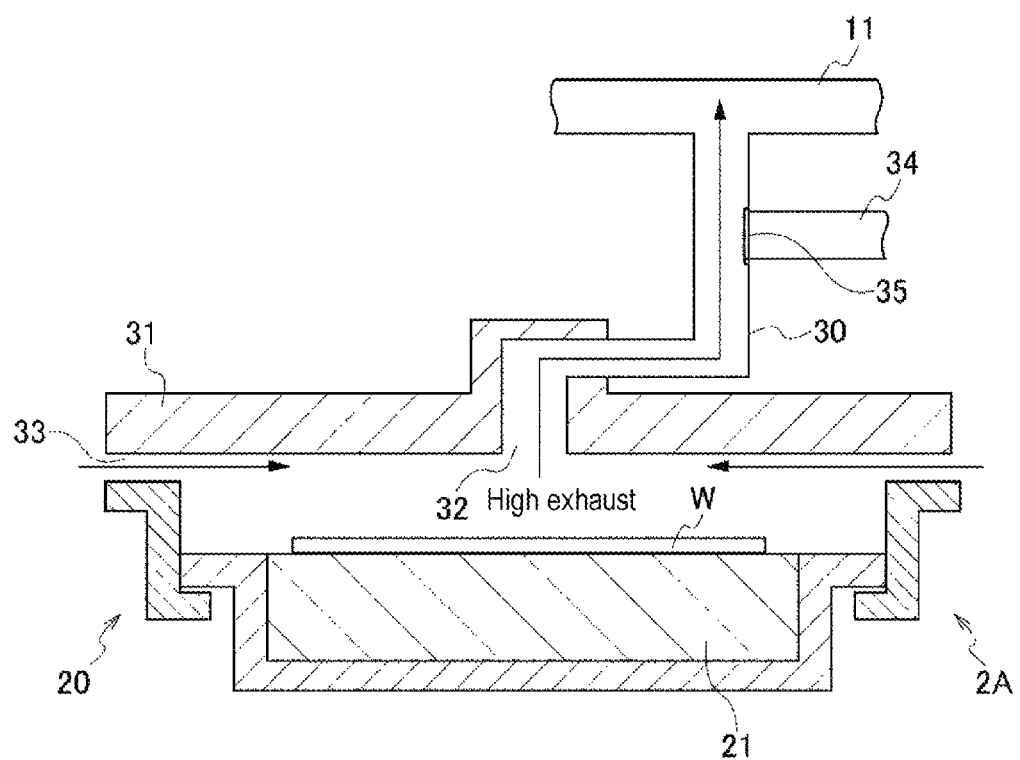
FIGS. 10 and 11 are explanatory views showing another configuration of the damper.
Figure 11:
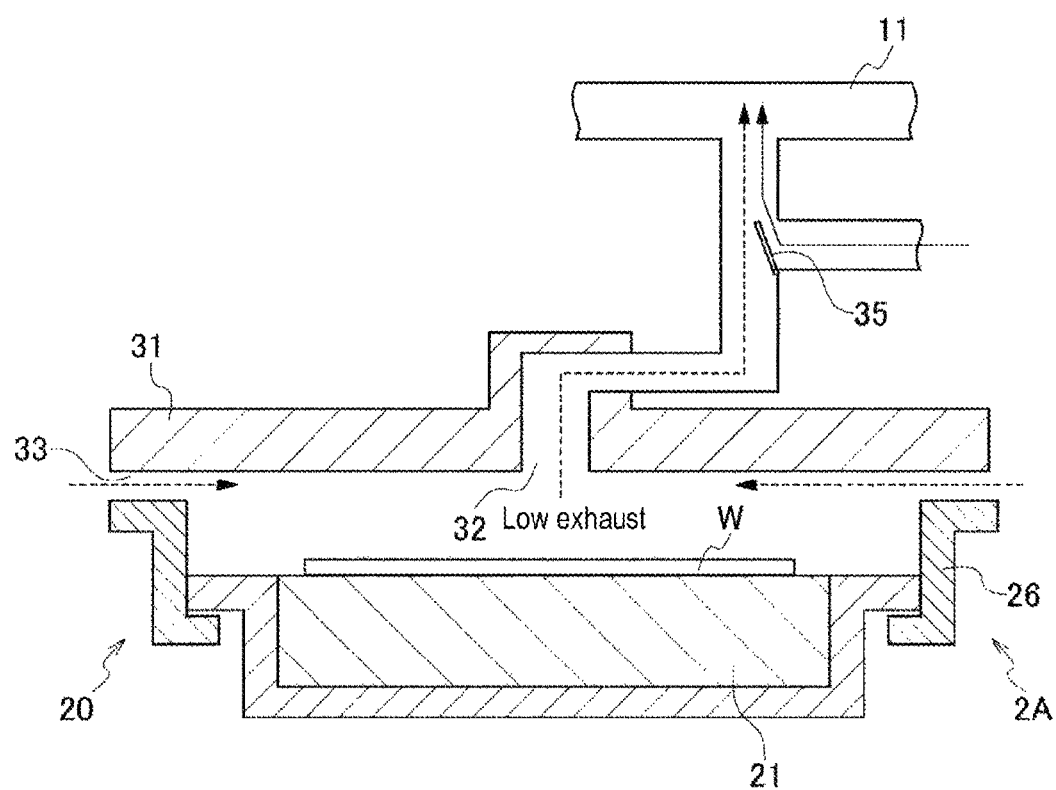

FIGS. 10 and 11 show another configuration example of the damper 35. In this example, the damper 35 is installed in a connection portion of the exhaust pipe 30 to which the branch pipe 34 is connected. In the connection portion, a state in which the air can flow from the downstream end of the branch pipe 34 into the exhaust pipe 30 and a state in which the flow of the air is cut off are switched to each other by the damper 35. Thus, the interior of the processing vessel 20 is switched to a low exhaust state or a high exhaust state. That is to say, the damper 35 may not be installed in the branch pipe 34 but may be installed in the exhaust pipe 30 as mentioned above.

The heating device 1 can be used in heating, e.g., a wafer W coated with a chemical solution for forming an anti-reflection film below a resist film. The chemical solution for forming the anti-reflection film contains a low-molecular-weight polymer and a cross-linking agent. At a temperature lower than a cross-linking temperature, the film thickness is easily affected by air flow. For that reason, in some embodiments, a heating process is performed by switching a low exhaust state and a high exhaust state as described above. The heating device 1 is not used only in processing the wafer W coated with the chemical solution capable of generating the cross-linking reaction. As an example, the heating device 1 may be used to heat a wafer W coated with a resist solution which does not generate the cross-linking reaction. If the temperature of the resist solution is low and if the viscosity of the resist solution is low due to the inclusion of a large amount of solvent, the film thickness of a resist film is easily affected by an air flow. For that reason, just like the processing of the organic film or the anti-reflection film described above, in some embodiments, the heating process is performed in a low exhaust state up to the temperature at which the generation amount of a sublimate becomes relatively large along with the curing of the film, and then the heating process is performed in a high exhaust state. In the processing performed by the respective heating modules 2A to 2C, it is only necessary that, in the low exhaust state, the uniformity of the film thickness distribution of the wafer W is not deteriorated. Therefore, the exhaust flow rate in the processing vessel 20 may be 0 L/min. That is to say, no exhaust may be performed in the low exhaust state.

(Evaluation Test)

Next, a description will be made on evaluation tests conducted with respect of the present disclosure. In the evaluation tests, a wafer W of 300 mm in diameter coated with a chemical solution for forming the aforementioned organic film was heated using the heating module described in the embodiment above. The heating was performed by changing the exhaust flow rate in the processing vessel 20 on a wafer-by-wafer basis. In evaluation tests 1-1 to 1-5, unlike the processing in the aforementioned embodiment, the heating was performed by keeping the exhaust flow rate constant in the processing vessel 20 from the start of the processing of the wafer W to the end of the processing. In evaluation tests 1-1, 1-2, 1-3, 1-4 and 1-5, the exhaust flow rates were set at 15 L/min, 0 L/min, 0.3 L/min, 0.5 L/min and 1 L/min, respectively. In evaluation test 1-6, as described in the embodiment, the switching from a low exhaust state to a high exhaust state was performed during the processing of the wafer W.

With respect to the wafers W processed in evaluation tests 1-1 to 1-6, the film thicknesses at a plurality of points within a plane were measured to calculate an average value, a 3-sigma, a range, a center range and an improvement rate. The term "range" refers to a difference between the maximum value and the minimum value of the film thicknesses acquired from the wafer W. The term "center range" refers to a difference between the film thickness measured at the center of the wafer W and the film thickness measured at one point spaced apart a predetermined distance from the center of the wafer W. The term "improvement rate" refers to an improvement rate of the center range acquired in other evaluation tests when the center range of evaluation test 1-1 is used as reference value. The improvement rate is represented by (the center range of evaluation test 1-1−the center range acquired in other evaluation tests)/(the center range of evaluation test 1-1)×100 (unit: %).

Figure 12:
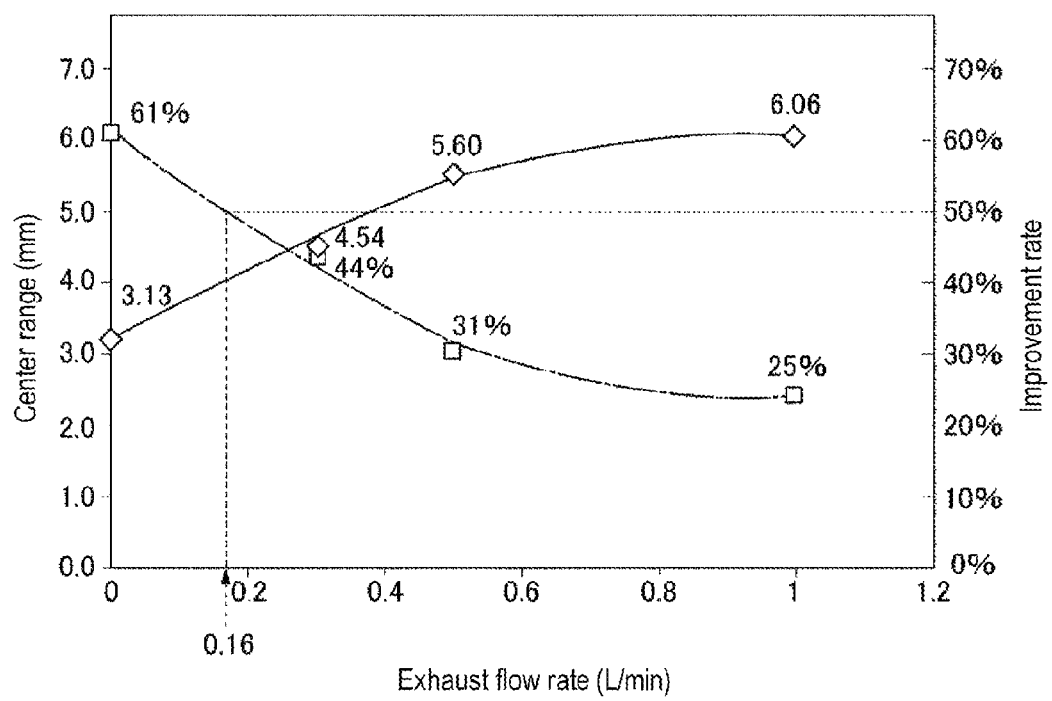
FIG. 12 is a graphical representation showing the results of evaluation tests.

Table 1 shown below indicates the measurement results of evaluation tests 1-1 to 1-6. Furthermore, the graph shown in FIG. 12 indicates the center range and the improvement rate obtained in evaluation tests 1-1 to 1-5. The horizontal axis of the graph indicates the exhaust flow rate in the processing vessel 20. The vertical axis of the graph indicates the center range and the improvement rate. The measurement results are plotted in the graph. In addition, approximate curves obtained based on the measurement results are shown in the graph. As shown in Table 1, the average film thicknesses obtained in evaluation tests 1-1 to 1-6 are substantially equal to one another. Evaluation test 1-6 is lower in the 3-sigma, the range and the center range, than evaluation tests 1-1 to 1-5 but is higher in the improvement rate than evaluation tests 1-1 to 1-5. Accordingly, it was confirmed that, if the processing is performed by switching the low exhaust state and the high exhaust state as mentioned in the above-described embodiment, the uniformity of the in-plane distribution of the film thickness of the wafer W can be made higher. Furthermore, in some embodiments, the improvement rate is set at 50% or less. It can be noted from the approximate curves of the graph shown in FIG. 12 that the exhaust flow rate is 0.16 L/min when the improvement rate is 50% and further that the improvement rate grows higher as the exhaust flow rate becomes lower. Accordingly, when the interior of the processing vessel 20 is kept in the low exhaust state in the above-described embodiment, the exhaust flow rate is set at 0.16 L/min or less.

TABLE 1

| Evaluation test | 1-1 | 1-2 | 1-3 | 1-4 | 1-5 | 1-6 |
|---|---|---|---|---|---|---|
| Exhaust flow rate (L/min) | 15 | 0 | 0.3 | 0.5 | 1 | low → high |
| Film thickness average value (nm) | 245.4 | 245.7 | 245.6 | 245.7 | 246.0 | 245.0 |
| 3-sigma | 5.6 | 3.6 | 3.3 | 3.5 | 3.7 | 2.3 |
| Range (nm) | 10.58 | 4.50 | 4.36 | 4.90 | 5.73 | 3.36 |
| Center range (nm) | 8.06 | 3.13 | 4.54 | 5.60 | 6.06 | 2.72 |
| Improvement rate (%) | — | 61 | 44 | 31 | 25 | 66 |

According to the present disclosure, the substrate heating device includes a common exhaust path connected to individual exhaust paths of a plurality of heating modules, a branch path branched from each of the individual exhaust paths and opened to the outside of a processing vessel, and an exhaust flow rate adjusting part configured to adjust a flow rate ratio of an exhaust flow rate of a gas exhausted from an exhaust port for the exhaust of the interior of the processing vessel into the common exhaust path and an introduction flow rate of a gas introduced from the outside of the processing vessel into the common exhaust path through the branch path. This makes it possible to change the exhaust flow rate of the gas exhausted from each of the individual exhaust paths of the heating modules and to suppress variation in the exhaust flow rate of the gas exhausted from the individual exhaust paths to the common exhaust path, which may be caused by the change of the exhaust flow rate. Accordingly, it is possible to accurately control the exhaust flow rate in the processing vessel of each of the heating modules. As a result, it is possible to reduce deterioration of the in-plane uniformity of a coated film formed on a substrate through a heating process. It is also possible to prevent the interior of the processing vessel from being contaminated by a sublimate generated from the coated film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate heating device, comprising:
    a plurality of heating modules, each of which includes a processing vessel within which a heating plate for mounting and heating a substrate is disposed, a first gas inlet port for introducing a purge gas into a processing atmosphere existing within the processing vessel, and an exhaust port for exhausting the processing atmosphere;
    individual exhaust paths, each of which is connected to the exhaust port of each of the plurality of heating modules;
    a common exhaust path connected to downstream ends of the individual exhaust paths of the plurality of heating modules;
    branch paths, each of which is branched from each of the individual exhaust paths and opened to the outside of the processing vessel;
    exhaust flow rate adjusting parts, each of which is configured to adjust a flow rate ratio of an exhaust flow rate of a gas exhausted from the exhaust port of each of the plurality of heating modules into the common exhaust path and an introduction flow rate of a gas introduced from the outside of the processing vessel into the common exhaust path through each of the branch paths; and
    a controller configured to control each of the exhaust flow rate adjusting parts to adjust the flow rate ratio based on a temperature of each of substrates mounted on the heating plate of each of the plurality of heating modules or an elapsed time after each of the substrates is mounted on the heating plate of each of the plurality of heating modules.

2. The device of claim 1, wherein the exhaust port is formed in a ceiling portion of the processing vessel so as to face a central portion of a substrate mounting region of the heating plate, and
    the first gas inlet port is formed along a circumferential direction of the heating plate such that the purge gas is admitted from a peripheral edge side of the substrate mounting region into the processing atmosphere.

3. The device of claim 1, wherein the controller is configured to output a control signal which enables each of the exhaust flow rate adjusting parts to adjust the flow rate ratio in order to select one of a low exhaust state in which the processing atmosphere is exhausted at a low exhaust flow rate and a high exhaust state in which the processing atmosphere is exhausted at an exhaust flow rate higher than the low exhaust flow rate.

4. The device of claim 3, wherein the controller is configured to control each of the exhaust flow rate adjusting parts such that the low exhaust state is maintained until a predetermined time is elapsed or the temperature of each of the substrates becomes equal to a predetermined temperature after each of the substrates is mounted on the heating plate of each of the plurality of heating modules and, then, the high exhaust state is maintained.

5. The device of claim 3, wherein, after each of the substrates is mounted on the heating plate of each of the plurality of heating modules, the controller is configured to control each of the exhaust flow rate adjusting parts such that the low exhaust state is maintained until a time including a time period during which, if the high exhaust state is selected, the in-plane uniformity of a film thickness deteriorates due to a low viscosity of a coating solution coated on the substrate, and, then once the time period elapses, the high exhaust state is maintained to remove a sublimate generated from a coated film.

6. The device of claim 3, wherein the controller is configured to output a control signal such that the low exhaust state is switched to the high exhaust state by gradually changing the flow rate ratio with each of the exhaust flow rate adjusting parts.

7. The device of claim 3, wherein the exhaust flow rate in the low exhaust state is 0.16 L/min or less.

8. The device of claim 1, wherein the first gas inlet port is connected to a gas supply path for supplying the purge gas into the processing vessel.

9. The device of claim 8, wherein a gas heating part for heating the purge gas is installed in the gas supply path.

10. The device of claim 1, wherein each of the plurality of heating modules further includes:
a second gas inlet port for introducing an ambient air which is a purge gas existing outside the processing vessel.

11. The device of claim 1, wherein a coated film is formed on a surface of each of the substrates mounted on the heating plate of each of the plurality of heating modules, the coated film mainly composed of carbon.

* * * * *